(12) United States Patent
Beach et al.

(10) Patent No.: US 7,449,783 B2
(45) Date of Patent: Nov. 11, 2008

(54) NONLINEAR VIA ARRAYS FOR RESISTORS TO REDUCE SYSTEMATIC CIRCUIT OFFSETS

(75) Inventors: Eric W. Beach, Tucson, AZ (US); Jimmy R. Naylor, Tucson, AZ (US); Walter B. Meinel, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 741 days.

(21) Appl. No.: 11/122,458

(22) Filed: May 5, 2005

(65) Prior Publication Data

US 2006/0249793 A1    Nov. 9, 2006

(51) Int. Cl.
*H01L 23/48*    (2006.01)

(52) U.S. Cl. .................. 257/774; 257/536; 257/358; 438/382

(58) Field of Classification Search .......... 257/774, 257/536, 358; 438/382
See application file for complete search history.

(56) References Cited

U.S. PATENT DOCUMENTS 6,150,971 A * 11/2000 Naylor et al. ............... 341/154
7,202,533 B1 * 4/2007 Beach et al. ................ 257/363
7,335,967 B2 * 2/2008 Watanabe ................... 257/536
7,345,573 B2 * 3/2008 Beach ............................ 338/9

* cited by examiner

Primary Examiner—Douglas M Menz
(74) Attorney, Agent, or Firm—Tum Thach; Wade J. Brady, III; Frederick J. Telecky, Jr.

(57) ABSTRACT

A thin film resistor structure includes a plurality of thin film resistor sections. Conductive vias (5) are disposed on a first end of each of the thin film resistor sections, respectively. The first conductor (2) is connected to the vias of the first end, and a second conductor (3) is connected to vias on a second end of each of the thin film resistor sections. A distribution of a parameter of a batch of circuits including the thin film resistor structure indicates a systematic error in resistance values. Based on analysis of the distribution and the circuit, or more of the vias are individually moved at the layout grid level by a layout grid address unit to reduce the systematic error by making corresponding adjustments on a via reticle of a mask set used for making the circuits. Expensive laser trimming of thin film resistors of the circuit is thereby avoided.

20 Claims, 4 Drawing Sheets

-500 PPM CHANGE
IN RESISTANCE

-156 PPM CHANGE
IN RESISTANCE

-206 PPM CHANGE
IN RESISTANCE

-294 PPM CHANGE
IN RESISTANCE

-225 PPM CHANGE
IN RESISTANCE

-69 PPM CHANGE
IN RESISTANCE

NONLINEAR VIA ARRAYS FOR RESISTORS TO REDUCE SYSTEMATIC CIRCUIT OFFSETS

BACKGROUND OF THE INVENTION

The present invention relates generally to systems and techniques for reducing systematic offsets/errors within integrated circuits caused by inaccuracies in thin film resistors, and more particularly to structures and methods for accomplishing reduction of the systematic offsets/errors without use of laser trimming or other type of trimming (such as electronic blowing of fuses) by using "layout grid address unit" (AU) reticle changes in an integrated circuit mask set.

High precision integrated circuits, such as R-2R DACs (digital to analog converters) and string DACs, usually rely on closely matched thin film resistors to achieve their high precision. The degree of achievable matching of thin film resistors is limited by the capability of the manufacturing process and also by the integrated circuit layout topology. Presently, most thin film resistors used in integrated circuit DACs, ADCs and the like are composed of nichrome, sichrome, or various common alloys thereof such as carbon-doped sichrome, aluminum nichrome, and tantalum nitride. In the prior art, a single "linear via" is provided at each end of a thin film resistor for making electrical contact to that end. In order to make a minimum resistance change or adjustment to the value of the thin film resistor by making a mask change, the effective length of the resistor is changed by changing the location of the linear via. The amount of change in the location of the via is an amount equal to an integral number of minimum layout grid address unit increments of the particular layout grid being utilized.

The resistances of thin film resistors can be adjusted or "trimmed" in various ways. Laser trimming of thin film resistors before packaging is a common but very expensive option. For example, the cost of an un-trimmed integrated circuit chip might be only approximately 10 cents, but a single laser trimming of its thin film resistors might cost approximately an additional 60 cents. Furthermore, in some cases, laser trimming of the resistors might be required at multiple temperatures, costing an additional 60 cents for trimming at each required temperature. The final cost of a packaged, laser-trimmed integrated circuit typically is at least three times greater than the cost if laser trimming is not required.

At the present state-of-the-art, the most accuracy that has been achieved in the prior art for low cost untrimmed, packaged DACs and ADCs has been approximately 12 bit resolution/accuracy.

The making of highly precise adjustments to the resistance of thin film resistors by modifying reticles of the integrated circuit mask set so as to modify the location of one or both of the linear vias at the ends of the resistors requires the ability to make precise measurements of the appropriate mask set reticles. The dimensions of mask set reticle features typically are magnified by 5× relative to the corresponding images optically projected onto the chip. This diminishes the size of any actual defect on the reticle by a factor of 5 by optically reducing the reticle image to the corresponding image on the chip during photolithography. Therefore, precise measurements of the 5× reticle, rather than of the actual thin film resistors on the chip, must be made in order to make precise mask set adjustments that will result in the desired modification of the resistance of a thin film resistor. Unfortunately, the large size of the corresponding features of a 5× mask set reticle is beyond the capabilities of the measurement instruments utilized in the making the reticles. Consequently, it would be very expensive and impractical to make precise adjustments by making mask set changes to minimize or eliminate systematic errors caused by mismatching of thin film resistors.

Thus, there is an unmet need for an improved thin film structure and technique which avoids the need to obtain precise measurements of mask set reticle features (the large size of which precludes use of available measurement instruments) in order to determine the magnitude of reticle changes needed to achieve desired values of, or ratios of, resistances of thin film resistors.

There also is an unmet need for an integrated circuit resistor structure and method which allows achievement of high accuracy thin film resistor ratios without the high expense of laser trimming.

There also is an unmet need for an integrated circuit resistor structure and method which allows achievement of precise thin film resistor ratios without laser or other kinds of trimming and with only a single modification of a single integrated circuit mask reticle.

There also is an unmet need for a way of substantially increasing the resolution/accuracy of untrimmed integrated circuit DACs and ADCs and the like.

SUMMARY OF THE INVENTION

It is an object of the invention to provide an improved thin film structure and technique which avoids the need to obtain precise measurements of mask set reticle features (the large size of which precludes use of available measurement instruments) in order to determine the magnitude of reticle changes needed to achieve desired values of, or ratios of, resistances of thin film resistors.

It is another object of the invention to provide an integrated circuit resistor structure and method which allows achievement of high accuracy thin film resistor ratios without the high expense of laser trimming.

It is another object of the invention to provide an integrated circuit resistor structure and method which allows achievement of precise thin film resistor ratios without laser or other kind of trimming and with only a single modification of a single integrated circuit mask reticle.

It is another object of the invention to provide an integrated circuit resistor structure and method which achieves much more precise adjustment of thin film resistors than has been previously achievable by modifying mask set reticles.

It is another object of the invention to provide an integrated circuit resistor structure and method which allows manufacture of substantially higher resolution/accuracy low-cost DACs, ADCs, and the like than has been previously achievable without use of laser trimming or other trimming techniques for adjusting the values of thin film resistors.

It is another object of the invention to provide a way of substantially increasing the resolution/accuracy of untrimmed integrated circuit DACs and ADCs and the like.

Briefly described, and in accordance with one embodiment, the present invention provides a thin film resistor structure and technique for determining mask set reticle adjustments needed to adjust the resistance of a thin film resistor. In one embodiment, the thin film resistor structure includes a plurality of thin film resistor sections, wherein a conductive via (5-1,2 . . . 7) is disposed on a first end of each thin film resistor section (R1-R7), respectively. A first conductor (2) is electrically connected to the via (5-1,2 . . . 7) of each of the thin film resistor sections (R1-R7) and a second conductor (3) is electrically connected to a second end of each of the thin film resistor sections (R1-R7), the first (2) and second (3)

conductors electrically connecting the plurality of thin film resistor sections (R1-R7) in parallel to form a composite thin film resistor (1), the pin location of one of the vias (5-1,2 . . . 7) being modified by at least a minimum address unit with respect to an initial location of that via so as to provide a slightly modified resistance of the composite thin film resistor (1). In a described embodiment, a conductive via (10-1,2 . . . 7) is disposed on the second end of each of the thin film resistor sections (R1-R7), wherein the second conductor (3) is electrically connected to the via (10-1,2 . . . 7) on the second end of each of the thin film resistor sections (R1-R7). The locations of a plurality of the vias (5-1,2 . . . 7) on the first ends of the thin film resistor sections (R1-R7) are modified by at least a minimum address unit with respect to an initial locations of those vias, respectively. The locations of a plurality of the vias (10-1,2 . . . 7) on the second ends of the thin film resistor sections (R1-R7) also may be modified by at least a minimum address unit with respect to an initial locations of those vias, respectively. In a described embodiment, the thin film resistor sections (R1-R7) are composed of SiCr and the vias (5-1,2 . . . 7) are composed of TiW, and each via (5-1,2 . . . 7) is connected to the first conductor (2) by means of a tungsten plug (6). Each via (5-1,2 . . . 7) is a base portion of a thin film resistor head (4) having a raised shoulder portion (4A) which does not contact the thin film resistor section (R1-R7) on which that via is disposed, the shoulder (4A) extending beyond the base portion by a distance which corresponds to an adjustment range (7 or 8) through which that via can be relocated to adjust the resistance of the thin film structure (1).

In a described embodiment, the thin film resistor structure (1) is included in a ladder resistor network of an integrated circuit digital to analog converter, wherein each resistor of the ladder resistor network is composed of at least one thin film resistor structure. A number of the vias (5-1,2 . . . 7) the location of which is modified by a minimum address unit is sufficient to produce a predetermined change in the ratio of two resistors of the ladder resistor network which determine a value of an analog output signal of the digital to analog converter in response to a corresponding input bit applied to the digital to analog converter.

In another embodiment, the invention provides the thin film resistor structure including a thin film resistive layer (15A) wherein a first linear via (50) disposed on a first end of the thin film resistive layer (15A), and a first conductor (2) electrically connected to the linear via (50) of the thin film resistive layer (15A) and a second conductor (3) electrically connected to a second end of the thin film resistive layer (15A). An edge (50A) of the linear via (50) is modified in a nonlinear fashion with respect to a straight initial edge (51) of the linear via (50) by at least a minimum address unit with respect to an initial location so as to provide a slightly modified resistance of the composite thin film resistor (1). In one embodiment, the modified edge includes a narrow rectangular portion (50A) extending from the straight initial edge (51). In another embodiment, the modified edge includes a curved section (50A). Another linear via similar to the first linear via can be disposed on a second end of the thin film resistive layer (15A).

In another embodiment, the invention provides a method of modifying the resistance of an initial configuration of a thin film composite resistor (1) which includes a plurality of thin film resistor sections (R1-R7) with a conductive via (5-1,2 . . . 7) disposed on a first end of each thin film resistor section (R1-R7), respectively, and a first conductor (2) electrically connected to the vias (5-1,2 . . . 7) of each of the thin film resistor sections (R1-R7), and a second conductor (3) electrically connected to the second end of each of the thin film resistor sections (R1-R7), the first (2) and second (3) conductors electrically connecting the plurality of thin film resistor sections (R1-R7) in parallel to form the composite thin film resistor (1), wherein the method includes obtaining a distribution of a circuit parameter indicative of the resistance of the thin film composite resistor (1) from a batch of the thin film composite resistors, and determining from the distribution an amount by which one or more of the vias (5-1,2 . . . 7) should be individually moved in order to cause a particular systematic change in the resistance of the thin film composite resistor. The thin film composite resistor (1) is part of an R-2R ladder resistor in an R-2R digital to analog converter, and the method includes obtaining a value of a ratio of the thin film composite resistor (1) and a similar thin film composite resistor and determining an amount of an error in the ratio. The amount of the error is determined by determining a linearity error an analog output signal produced by the digital to analog converter in response to an input bit of the digital to analog converter which corresponds to the ratio of the thin film composite resistor (1) and the similar thin film composite resistor.

DETAILED DESCRIPTION OF THE PREFERRED EMBODIMENTS

Figure 1:
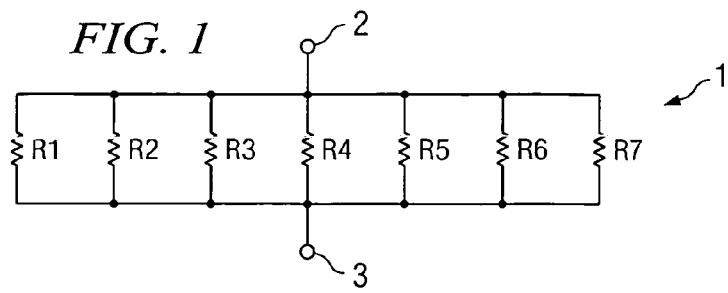
FIG. 1 is a schematic diagram of a composite thin film resistor composed of 7 segments connected in parallel.

Referring to FIG. 1, composite thin film resistor 1 includes 7 segments or sections R1-R7 of SiCr thin film resistive material connected in parallel. The upper end of each of resistor sections R1-R7 is electrically connected to conductor 2 and the lower end of each of resistor sections R1-R7 is electrically connected to conductor 3, whereby conductors 2 and 3 are the terminals of composite resistor 1.

Figure 2:
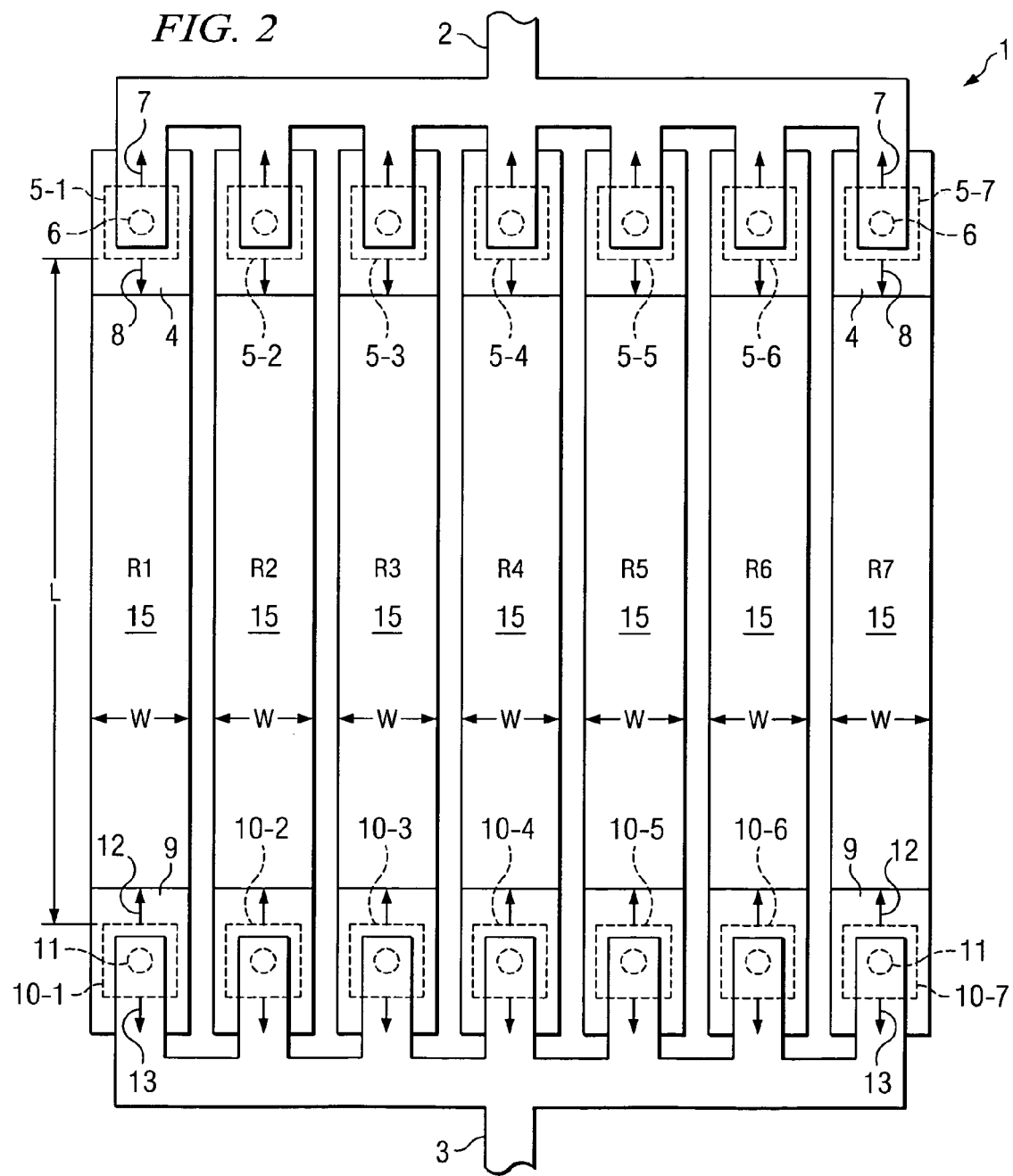
FIG. 2 is a plan view diagram of an integrated circuit implementation of the composite thin film resistor shown in FIG. 1.

FIG. 2 shows a top view of composite resistor 1, with thin film resistor sections R1-R7 shown as seven separate identical, elongated parallel layers. Each resistor section R1-R7 includes an identical resistive strip or layer 15, which can be SiCr. A thin film resistor head 4 is disposed on the upper end of each SiCr layer, respectively, and a thin film resistor head 9 is disposed on the lower end of each SiCr layer, respectively. The thin film resistor heads 4 and 9 can be composed of TiW (titanium tungsten). Thin film resistor heads 4 each include a base or thin film via section 5-1,2 . . . 7 that physically and electrically contacts the upper ends of the corresponding SiCr layers 15, respectively, as shown in subsequently described FIG. 4B. Similarly, thin film resistor heads 9 each include a thin film via section 10-1,2 . . . 7 that physically and electrically contacts the lower ends of the corresponding SiCr layers 15, respectively. The outer portion of each head 4 and each head 9 extends outwardly beyond the various via sections 5-1,2 . . . 7 and 10-1,2 . . . 7, respectively, and is above and separated from the surface of the SiCr layer 2 (as shown in FIG. 4B) by a sub-layer of dielectric. The upper surface of each TiW head 4 is electrically connected by a tungsten via plug 6 to conductor 2, which typically is composed of aluminum or aluminum alloy metallization. The lower heads 9 similarly make electrical contact to conductor 3 by means of tungsten via plugs 11.

Arrows 7 indicate how far the thin film vias 5-1,2 . . . 7 can be individually moved upward to incrementally increase the resistances of resistor sections R1-R7, respectively, and arrows 8 indicate how far the thin film vias 5-1,2 . . . 7 can be moved downward to incrementally decrease the resistances of resistor sections R1-R7, respectively. Similarly, arrows 13 indicate how far the thin film vias 10-1,2 . . . 7 can be individually moved downward to incrementally increase the resistances of resistor sections R1-R7, respectively, and arrows 12 indicate how far the thin film vias 5-1,2 . . . 7 can be moved upward to incrementally decrease the resistances of resistor sections R1-R7, respectively.

FIGS. 3A-3F are a sequence of diagrams illustrating various combinations of how the thin film vias 5-1,2 . . . 7 of thin film resistor heads 4 can be moved axially along the resistor body 15 to incrementally increase or decrease the resistances of the corresponding SiCr layers R1-R7 by making via reticle location adjustments in the mask set so as to reduce systematic error that has been discovered by analyzing an initial batch of an integrated circuit including the composite resistor 1 of FIG. 2 and other similar composite resistors.

Figure 3A:
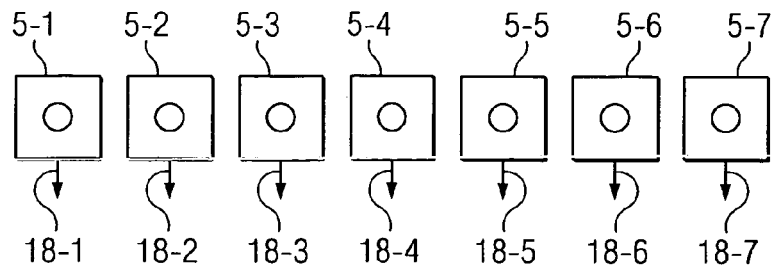
FIGS. 3A-3F illustrate different possible mask set reticle via adjustments that can be made to the upper thin film resistor head sections of the composite thin film resistor shown in FIG. 1 to reduce systematic error in the composite resistor of FIG. 2.

In FIG. 3A, arrows 18-1,2 . . . 7 indicate that composite resistor 1 can be fabricated using a via reticle modified such that all of thin film vias 5-1,2 . . . 7 are moved downward by an increment corresponding to one layout grid address unit, which is 0.05 microns for the embodiments described. (The modified layout grid database is later used to generate corresponding address unit corrections/movements of vias at the reticle level.) FIG. 3A also indicates that this increment has been determined, by an analysis of the above-mentioned initial batch of integrated circuits including composite resistor 1 and other similar composite resistors, to cause a −500 ppm (parts per million) change in its resistance, wherein each of the resistor sections R1-R7 has a pre-adjustment length L equal to 100 microns and a width W equal to 8 microns. The length L of each of resistor sections R1-R7 is the distance between the bottom edge of the corresponding thin film via 5-1,2 . . . 7 and the top edge of the corresponding thin film via 10-1,2 . . . 7, respectively, as indicated in FIG. 2.

Figure 3B:
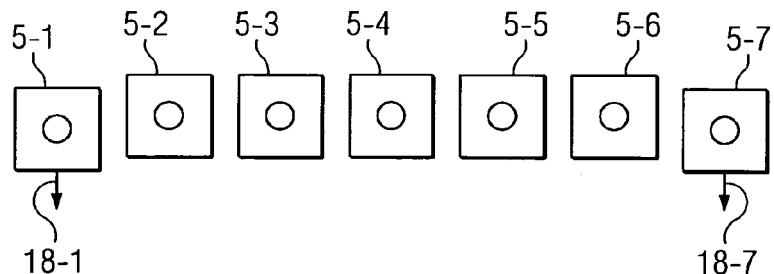
Figure 3C:
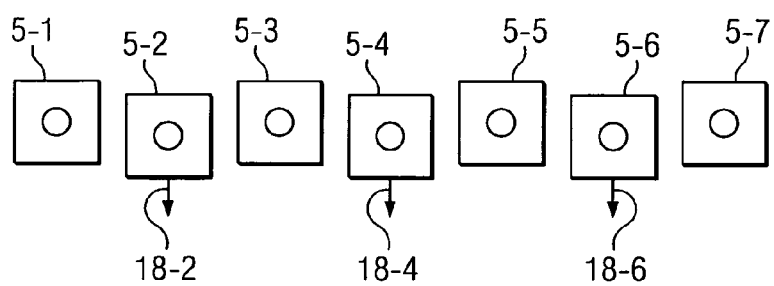
Figure 3D:
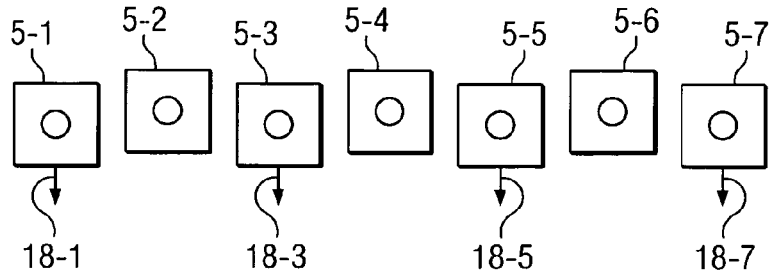
Figure 3E:
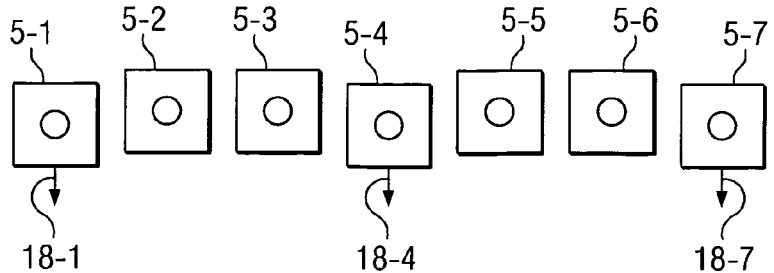
Figure 3F:
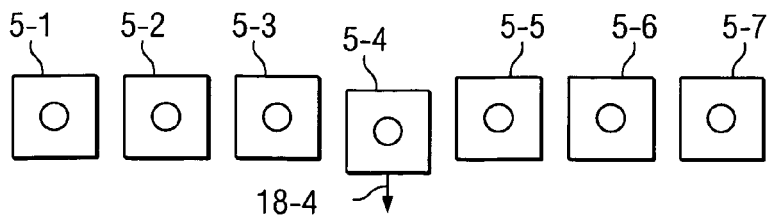

Similarly, in FIG. 3B arrows 18-1 and 18-7 indicate that composite resistor 1 can be fabricated using a via reticle modified such that only thin film vias 5-1 and 5-7 are moved downward one layout grid address unit. FIG. 3B also indicates that this has been determined, by the analysis of an initial batch of integrated circuits including composite resistor 1 and other similar composite resistors, to cause a −156 ppm change in its resistance. In FIG. 3C arrows 18-2, 18-4 and 18-6 indicate that composite resistor 1 can be fabricated using a via reticle modified such that thin film vias 5-2, 5-4 and 5-6 are moved downward by an amount corresponding to one layout grid address unit. FIG. 3C also indicates that this has been determined, by the analysis of an initial batch of integrated circuits including composite resistor 1 and other similar composite resistors, to cause a −206 ppm change in its resistance. In FIG. 3-D, arrows 18-1, 18-3, 18-5 and 18-7 indicate that composite resistor 1 can be fabricated using a via reticle modified such that thin film vias 5-1, 5-3, 5-5 and 5-7 are moved downward by an amount corresponding to one layout grid address unit. FIG. 3D also indicates that this has been determined, by the analysis of an initial batch of integrated circuits including composite resistor 1 and other similar composite resistors, to cause a −294 ppm change in the resistance of that composite resistor. In FIG. 3E, arrows 18-1, 18-45 and 18-7 indicate that composite resistor 1 can be fabricated using a via reticle modified such that thin film vias 5-1, 5-4 and 5-7 are moved downward by an amount corresponding to one layout grid address unit. FIG. 3E also indicates that this has been determined, by the analysis of an initial batch of integrated circuits including composite resistor 1 and other similar composite resistors, to cause a −225 ppm change in the resistance of that composite resistor. And finally, in FIG. 3-E arrow 18-4 indicates that composite resistor 1 can be fabricated using a via reticle modified such that thin film via 5-4 is moved downward by an amount corresponding to one layout grid address unit. FIG. 3F also indicates that this has been determined, by an analysis of the initial batch of integrated circuits including composite resistor 1 and other similar composite resistors, to cause a −69 ppm change in the resistance of the composite resistor. (Note that in FIG. 3E, three vias have been moved one layout grid address unit, resulting in a −225 ppm change in resistance. The reason this result is different than for FIG. 3C, in which three vias are also moved one layout grid address unit, is that because of the way the composite resistor 1 is laid out, the resistor sections on the outside edges of composite resistor 1 have a slightly higher resistance due to so-called edge effects. Consequently, the sensitivity of inner resistor sections R2 and R6 in FIG. 3C to the shifting of the vias is slightly less than the sensitivity of outer resistor sections R1 and R7 in FIG. 3E.)

Figure 4A:
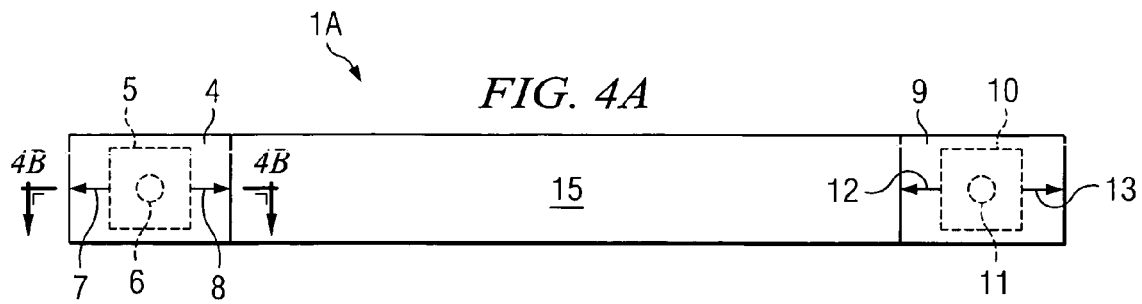
FIG. 4A is a plan view of a segment of a composite thin film resistor illustrating adjustment ranges of the vias of the head sections thereof.
Figure 4B:
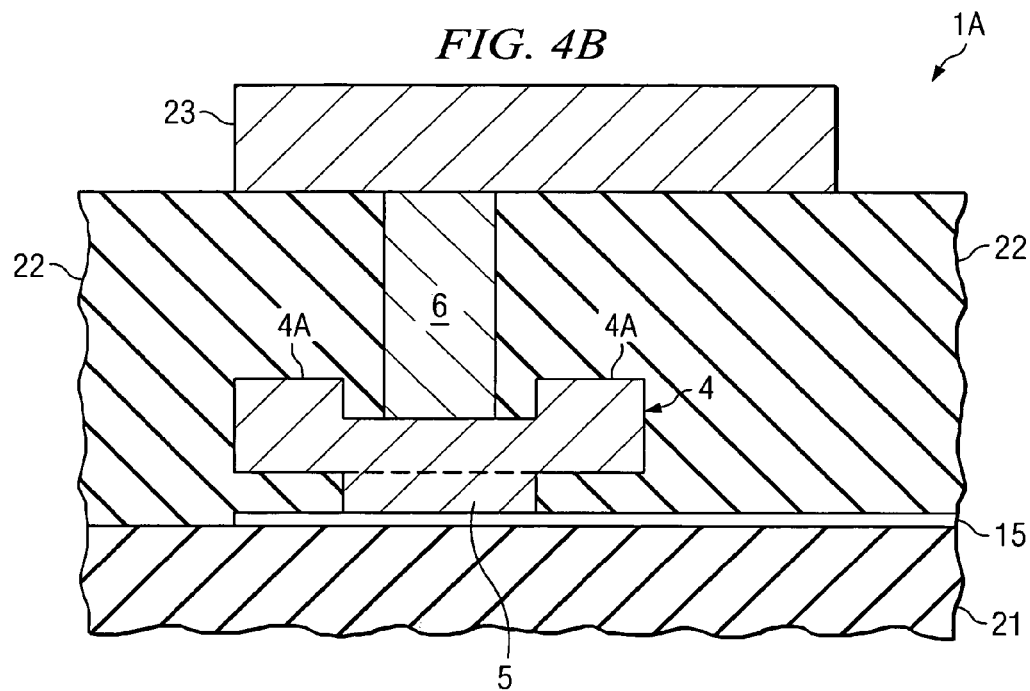
FIG. 4B is a section view along section line 4B-4B of part of the integrated circuit device structure of the thin film resistor shown in FIG. 4A.

FIG. 4A shows a plan view of a single resistor section of the kind shown in FIGS. 3A-3F. FIG. 4B illustrates a further expanded section view illustrating the portion of thin film resistor head section 4 taken along section line 4B-4B of FIG. 4A. In FIG. 4B, SiCr resistor layer 15 is formed on a high density plasma enhanced TEOS or HDP (high density plasma) oxide layer 21. In the described embodiment, SiCr resistor layer 15 is only 32 Angstroms thick (but it could be in the range of approximately 20 to 200 Angstroms in thickness). Thin film resistor head 4 has a shoulder portion 4A formed on a sublayer (not shown) of PECVD (plasma enhanced chemical vapor deposition)/TEOS (tetrethylorthosilicate) layer 22, which is formed on HDP oxide layer 21 and SiCr resistor layer 8. Thin film resistor head 4 also has a thin film via portion 5 which physically and electrically contacts the left end of SiCr resistor section or layer 8. Tungsten via plug 6 extends through oxide layer 22 up to the bottom of a metallization layer 23 formed on layer 22.

Figure 5:
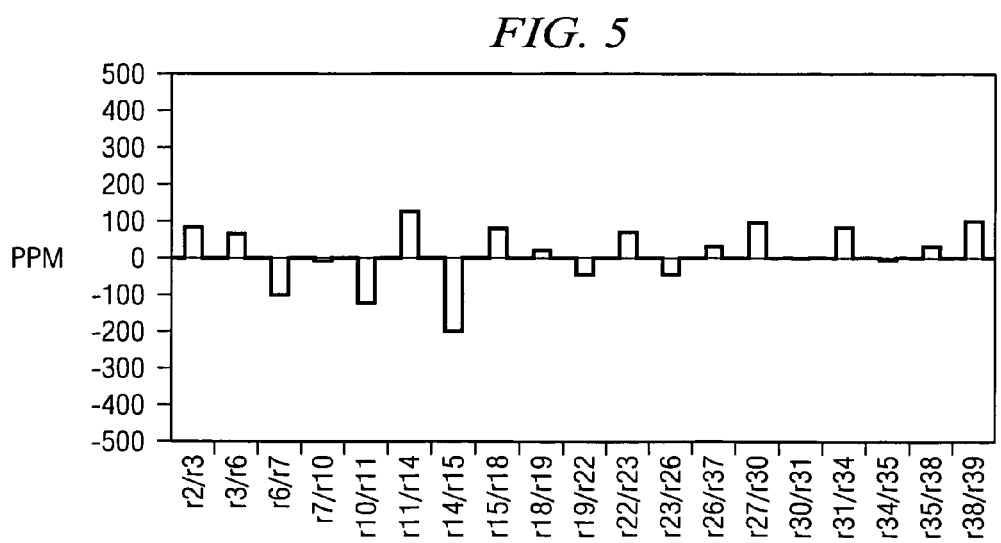
FIG. 5 is a plot of the distribution of systematic offset errors caused by various pairs of the thin film resistors in a particular R-2R DAC (digital to analog converter).

FIG. 5 shows a distribution of systematic offset errors caused by various pairs of thin film resistors, respectively in an R-2R DAC (not illustrated). The vertical axis indicates positive and negative changes, in ppm, of various ratios of resistor pairs that are indicated along the horizontal axis. In FIG. 5, the 19 resistor ratios indicated along the horizontal axis represent ratios of thin film resistors that are each composed of one or more thin film composite resistors (such as the one shown in FIG. 2) in the R-2R ladder network of the R-2R DAC. The first 8 most significant bits of the R-2R DAC are referred to herein as bits B1, B2 . . . B8, bit B1 being the most significant bit. The most significant bit B1 is "segmented" into 8 "segments", each of which has the composite thin film resistor structure shown in FIG. 2. The next most significant bit B2 is segmented into 4 segments each having the composite thin film structure shown in FIG. 2. Bit B3 is segmented into 2 segments each having the structure of the composite thin film resistor structure shown in FIG. 2. The remaining bits of the DAC are unsegmented.

The above-mentioned "segmentation" of the R-2R ladder resistors corresponding to the few most significant bits of an R-2R DAC is done to equalize the current densities in the thin film resistive material of which those ladder resistors are composed. High current densities in the thin film resistive material of which the composite resistors of which the most significant bits are composed would cause undesirable self heating in the thin film resistors. This would cause inaccuracies in the R-2R ladder network resistor values and in the resistor ratios, and hence in the resolution/accuracy of the DAC. The above-mentioned segmented structure is utilized because in an R-2R ladder network, the voltage on each successive ladder node (beginning with the most significant leg of the ladder network) would be equal to the voltage of the previous node divided by 2, so the current density in the ladder network resistors in the corresponding successive legs of the ladder would be scaled lower, the current density in each being equal to the current density in the previous one divided by 2. (In the presently described R-2R DAC, the resistor adjustment technique of the present invention is performed only for the thin film resistors used for the first 8 most significant bits B1-B8 because any adjustments to the least significant bits B9-B16 would be insignificant to the DAC resolution.)

FIG. 5 in effect statistically illustrates non-linearity in an initial batch of 16-bit R-2R DACs. FIGS. 3A-3F and subsequently described Table 1 illustrate the resolution/accuracy improvement achieved by one-address-unit increments at the mask set layout grid level to adjust the via locations of the various 8 micron wide by 100 micron long resistor SiCr resistor sections R1-R7 as shown in FIGS. 2 and 3A-3F.

More specifically, FIG. 5 represents the error distribution of the effects on the linearity of the DAC output signal caused by errors in the various thin film resistor ratios of the R-2R ladder network of the DAC as indicated on the horizontal axis in FIG. 5 for an initial batch of the R-2R DACs. Each of the resistor ratios referred to corresponds to a separate digital input bit applied to the DAC. FIG. 5 shows the results of measurement of the resistor ratios. In this case, extra metal test pads were provided in the R-2R ladder array and used to measure the various node voltages in the R-2R ladder array in order to determine the resistor ratio values. The various node voltages of the R-2R ladder array were measured and on this basis it was determined which resistor ratios and resistors produced errors that affected the INL (integral linearity) and DNL (differential linearity) of the DAC, and on that basis the resistance changes needed were determined in ppm.

Table 1 shows various combinations of individual resistances for resistor sections R1-R7 and the resulting total resistance Rtotal for an individual composite resistor 1 for the various combinations of its thin film vias with locations modified at the layout grid level by one layout grid address unit. The via adjustments for several of the rows in Table 1 are illustrated in FIGS. 3A-3F.

TABLE 1

(Examples of the adjustments available to a 100 micron by 8 micron resistor
Resistor is 100 microns long by 8 microns wide

| R1 | R2 | R3 | R4 | R5 | R6 | R7 | R total | Adjust (ppm) |
|---|---|---|---|---|---|---|---|---|
| 80000 | 90909.09 | 90909.09 | 90909.09 | 90909.09 | 90909.09 | 80000 | 12500 | 0 |
| 79960 | 90863.64 | 90863.64 | 90863.64 | 90863.64 | 90863.64 | 79960 | 12493.8 | −500 |
| 79960 | 90909.09 | 90863.64 | 90909.09 | 90863.64 | 90909.09 | 79960 | 12496.3 | −294 |
| 79960 | 90909.09 | 90909.09 | 90863.64 | 90909.09 | 90909.09 | 79960 | 12497.2 | −225 |
| 80000 | 90863.64 | 90909.09 | 90863.64 | 90909.09 | 90863.64 | 80000 | 12497.4 | −206 |
| 79960 | 90909.09 | 90909.09 | 90909.09 | 90909.09 | 90909.09 | 79960 | 12498.0 | −156 |
| 80000 | 90909.09 | 90863.64 | 90909.09 | 90863.64 | 90909.09 | 80000 | 12498.3 | −138 |
| 80040 | 90909.09 | 90818.18 | 90909.09 | 90818.18 | 90909.09 | 80040 | 12498.5 | −119 |
| 79960 | 90954.55 | 90863.64 | 90954.55 | 90863.64 | 90954.55 | 79960 | 12498.9 | −88 |
| 80000 | 90909.09 | 90909.09 | 90863.64 | 90909.09 | 90909.09 | 80000 | 12499.1 | −69 |
| 80040 | 90909.09 | 90863.64 | 90863.64 | 90863.64 | 90909.09 | 80040 | 12499.4 | −50 |
| 79960 | 90909.09 | 90909.09 | 91000 | 90909.09 | 90909.09 | 79960 | 12499.8 | −19 |
| 80040 | 90909.09 | 90909.09 | 90818.18 | 90909.09 | 90909.09 | 80040 | 12500.2 | 19 |
| 80000 | 90909.09 | 90909.09 | 90954.55 | 90909.09 | 90909.09 | 80000 | 12500.9 | 69 |
| 80040 | 90863.64 | 90954.55 | 90863.64 | 90954.55 | 90863.64 | 80040 | 12501.1 | 87 |
| 80040 | 90909.09 | 90909.09 | 90909.09 | 90909.09 | 90909.09 | 80040 | 12502.0 | 156 |
| 80000 | 90954.55 | 90909.09 | 90954.55 | 90909.09 | 90954.55 | 80000 | 12502.6 | 206 |
| 80040 | 90909.09 | 90909.09 | 90954.55 | 90909.09 | 90909.09 | 80040 | 12502.8 | 225 |
| 80040 | 90909.09 | 90954.55 | 90909.09 | 90954.55 | 90909.09 | 80040 | 12503.7 | 294 |
| 80040 | 90954.55 | 90954.55 | 90954.55 | 90954.55 | 90954.55 | 80040 | 12506.3 | 500 |

Specifically, Table 1 is based on moving one or more vias (for example, as shown in FIGS. 3A-3F) at one end of the resistive layer 15 of each of thin film resistor segments R1-R7. Thus, Table 1 shows the effect on the total resistance Rtotal of composite resistor 1 of various different "senarios" of making various resistor segments R1-R7 of the composite resistor a single layout grid address unit longer or shorter by moving a via at one end. The same effect on the resistance of thin film segments R1-R7 can be achieved moving (at the layout grid level) corresponding vias at the other end of the resistor segment 8 by one layout grid address unit.

A skilled DAC designer would be aware of the relationship between the various resistor ratios shown along the horizontal axis in FIG. 5 and the digital inputs applied to the DAC and the resulting analog output signals. The DAC designer therefore could readily determine, from the linearity of the analog output signal versus digital input transfer characteristic of the DAC, which input bits of the DAC, and therefore which resistor ratios of the R-2R ladder array, would be causing the systematic linearity errors causing the error distribution. With that knowledge, the skilled DAC designer could generate the distribution shown in FIG. 5 from the linearity of the output characteristics of an initial batch of the R-2R DACs. All of the thin film resistors that affect the linearity represented by the linearity error distribution of FIG. 5 are identical to composite resistor 1 in FIG. 2 or are scalable with respect to it.

Alternatively, the skilled DAC designer could determine from the measured integral linearity and differential linearity results which resistor ratios need to be adjusted and by how many ppm in order to achieve the ideal integral linearity and differential linearity. Without having the above-mentioned extra metal test pads available in the R-2R ladder array, the DAC designer would need to determine the ppm information in FIG. 5 on the basis of the INL and the DNL characteristics of the DAC by applying a range of digital inputs to the DAC, observing the resulting analog output signals, determining errors in the differential and integral nonlinearity characteristics in terms of the number of LSB bits of linearity error, and converting that information to ppm. (This is what DAC designers frequently do when laser trimming is performed, in order to determine how much laser trimming is required for which resistors of the R-2R ladder network. Algorithms to accomplish this are commonly available.)

In any case, the skilled a DAC designer can readily determine which of the most significant resistor ratios in the R-2R ladder array should be changed to achieve the desired linearity of the DAC transfer characteristic. The DAC designer then can determine which R-2R ladder resistors should be modified. By referring to Table 1 and also referring to the circuit configurations of how the various ladder network resistors are constructed of the thin-film composite resistors as shown in FIG. 2, the DAC designer can determine how the via locations of various segments R1-R7 of the various composite resistors should be adjusted so as to adjust the various ppm errors of the ladder network resistor ratios shown in FIG. 5 to approximately zero.

Referring to FIG. 5, note that the R-2R ladder resistors are denoted by lower case "r"s, whereas the composite thin film resistor segments of which the various ladder resistors r2, r3, etc. are constructed are designated by upper case "R"s, as in R1-R7. In FIG. 5, it can be readily seen that ladder resistance r2 is high relative to r3, that r3 is high relative to r6, that r6 is low relative to r7 and so forth. Specifically, FIG. 5 shows that r2 needs to be reduced by about 80 ppm. Table 1 can be referred to determine which vias of the composite thin film resistors of which ladder resistor r2 is composed should be adjusted by one grid layout address unit. For example, the resistance r2 of ladder resistor r2 can be lowered by −88 ppm by adjusting the vias of thin film segments R1-R7 as indicated in the particular row of Table 1 which indicates the "Adjust (ppm)" value to be −88 ppm.

The main idea is to adjust the various vias of the composite resistors of which the R-2R ladder resistors are composed so that errors of the ladder resistor ratios shown in the vertical scale of FIG. 5 are reduced as close to zero as practical. If all of the ratio errors are reduced to zero, then perfect resolution of the 16-bit DAC is achieved. For example, the error distribution of the resistor ratio r14/r15 in FIG. 5 is approximately −200 ppm. That error represents a systematic error which indicates how far off the random error distribution is from being centered about zero, assuming that the random error distribution caused by the manufacturing process is relatively small. (If the random error of the thin-film resistor process is substantially greater than the systematic error caused by reticle errors, then it generally is not helpful to adjust the much smaller systematic errors.) The maximum error in FIG. 5 establishes the linearity of the DAC, and the large −200 ppm error associated in FIG. 5 with the ratio r14/r15 indicates how much adjustment needs to be made to eliminate the systematic error. By referring to Table 1, the DAC design engineer can compare the effect of making various combinations of individual via location adjustments in order to determine a combination of individual layout grid address unit via location changes to the mask set via reticle at the layout grid level so as to reduce the error distribution for each of the most significant 8 bits of the DAC to nearly zero.

The invention thus provides the DAC designer with a method for reconfiguring the DAC design (using the original reticle) after the initial batch of DACs has been fabricated and analyzed, by modifying only the via reticle so as to achieve the desired integral linearity (INL) and differential linearity (DNL). This allows the making of a high resolution/accuracy DAC (or ADC) without laser trimming or other resistor trimming operation, and thereby allows the making of a much lower cost high resolution/accuracy DAC (or ADC).

Figure 6:
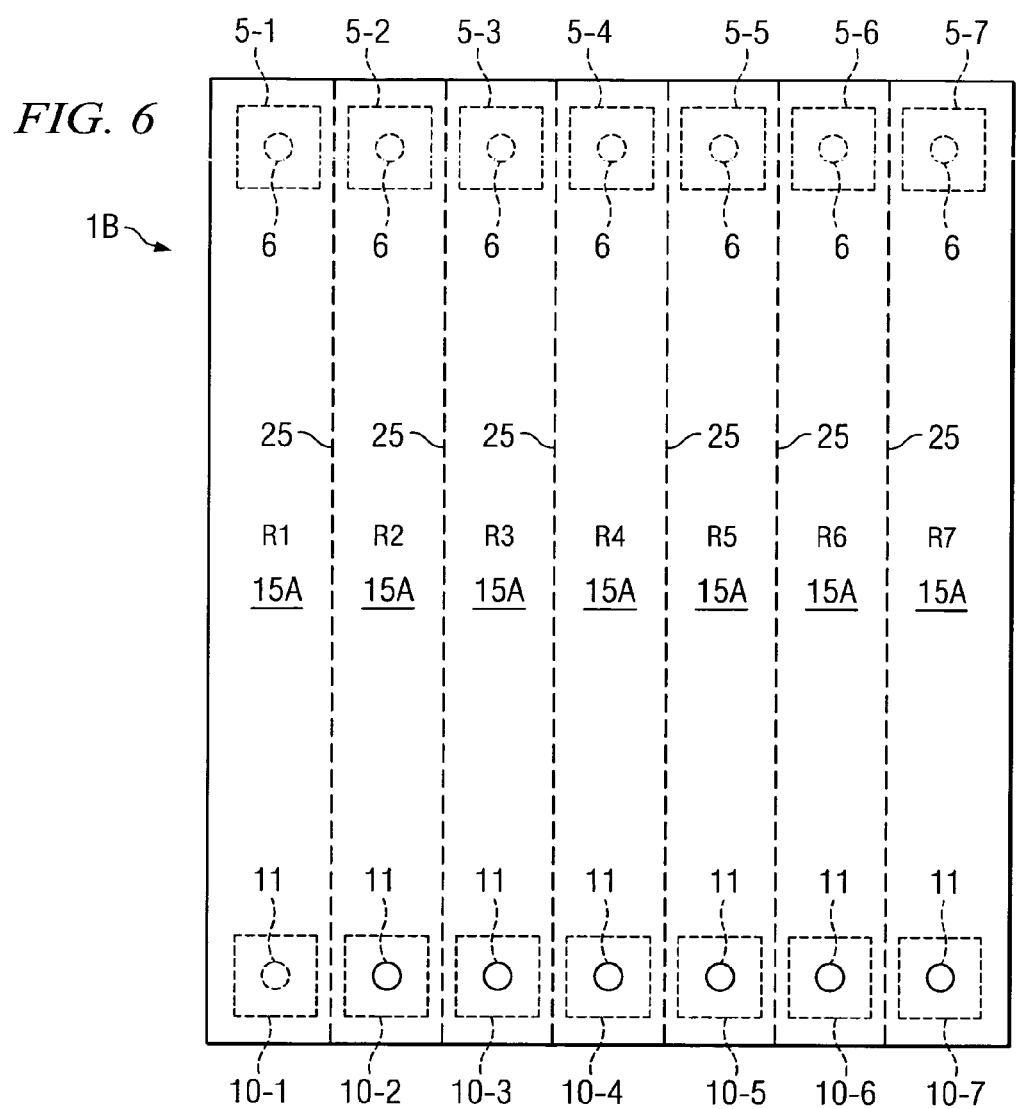
FIG. 6 is a plan view diagram of a single thin film resistor having individually movable head section vias.

FIG. 6 is a top view diagram of another embodiment of the invention, including a thin film resistor 1B composed of a single rectangular SiCr layer 15A, which can be thought of as being partitioned into seven contiguous sections separated by imaginary lines 25 and corresponding to resistor sections R1-R7 of FIG. 2, as illustrated in FIG. 6. The length L and the width W of each of the seven contiguous sections in FIG. 6 can be thought of as being the same as for the separate resistor sections R1-R7 in FIG. 2. The thin film vias 5-1,2 . . . 7 and 10-1,2 . . . 7 in FIG. 6 can be identical to the corresponding thin film vias in FIG. 2. The main idea, however, is essentially the same as previously described with reference to FIGS. 2, 3A-3F.

Figure 7A:
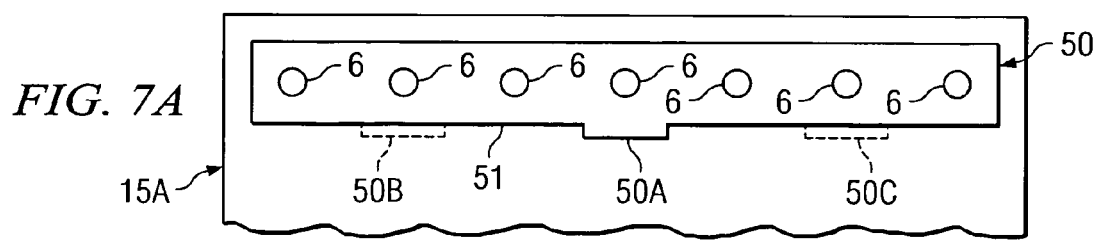
FIG. 7A is a plan view of one end of a thin film resistor having a linear via with an edge notched so as to produce a predetermined resistance change or resistance ratio change associated with the thin film resistor.

The invention also is applicable to via configurations that are similar to that shown in FIG. 6 except that a single linear via is utilized, instead of the multiple "individually movable" vias shown in FIG. 6. (The term "linear via" is used herein to refer to any via that extends across essentially the entire width of an end of a thin film resistor.) FIG. 7A shows a single linear via 50 which electrically contacts one end of a thin film resistor layer 15A, wherein a one-address-unit change represented by an extending rectangular portion or a notch 50A is made in the mask set reticle that defines linear via 50 in order to achieve a small predetermined reduction in the resistance of resistor 2A corresponding, in essence, to the change indicated in FIG. 3F. Additional extending rectangular portions or notches, such as portions 50B and 50C indicated in dashed lines, also could be provided.

Figure 7B:
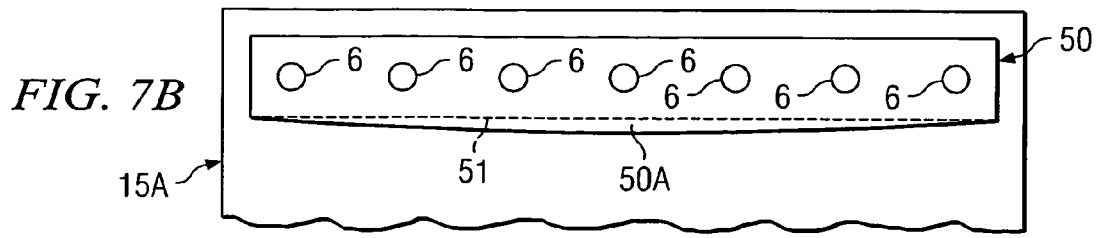
FIG. 7B is a plan view of one end of a thin film resistor having a linear via with a curved edge selectively configured so as to produce a predetermined resistance change or resistance ratio change associated with the thin film resistor.

FIG. 7B illustrates a similar configuration, in which the mask set reticle which defines thin film via 50 is modified by a curved lower edge 50A which extends a predetermined amount below the original lower boundary of via 50, indicated by dashed line 51, to achieve a small predetermined reduction in the resistance of resistor 15A.

The present invention results in a large improvement in the accuracy of matching of thin film resistors, and also results in a large reduction in the manufacturing cost, if a high-quality thin film resistor manufacturing process having tight process distribution parameters is being used. For example, at the present state of the art, the highest accuracy/resolution that has been previously achievable in an un-trimmed packaged R-2R DAC is approximately 12 bits of resolution/accuracy. In contrast, the use of the techniques of the present invention makes it possible to produce an un-trimmed, and therefore low cost, R-2R DAC or the like having approximately 16 bits of resolution/accuracy. Furthermore, the present invention not only provides the much higher resolution/accuracy than is achievable without laser trimming (or other type of trimming) by other prior art processes, the invention achieves this result with only a single reticle revision of the mask set. The ability to eliminate the thin film resistor laser trimming operations previously required to achieve high (e.g., 16-bit) accuracy/resolution of a DAC or ADC or the like greatly reduces the cost of manufacture. The described embodiment of the invention is generally applicable to manufacture of thin film resistors, including nichrome and sichrome and various common alloys thereof such as carbon-doped sichrome, aluminum nichrome, and tantalum nitride, and including integrated circuit thin film resistors and discrete thin film resistors.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although the described embodiments of the invention are presently most useful for state-of-the-art thin film resistors, the technique could be useful in the manufacture of other circuit components. Instead of adjusting the via reticle by an amount corresponding to a single layout grid address unit as described, in some cases it might be practical to adjust the via reticle by an amount corresponding to two or more layout grid address units. The invention is applicable to a comb-shaped resistive thin-film resistor structure in which spaced resistive "finger" sections extend from a single resistive "bar" section, wherein separate "adjustable" vias such as vias 5-1,2 . . . 7 are provided on the tips of the finger sections and a conventional linear via is provided on the single resistive bar section from which the finger sections extend.

What is claimed is:

1. A thin film resistor structure, comprising:
   (a) a plurality of thin film resistor sections;
   (b) a conductive via disposed on a first end of each thin film resistor section, respectively;
   (c) a first conductor electrically connected to the vias of each of the thin film resistor sections and a second conductor electrically connected to a second end of each of the thin film resistor sections, the first and second conductors electrically connecting the plurality of thin film resistor sections in parallel to form a composite thin film resistor; and
   (d) the location of one of the vias being modified by at least a minimum address unit with respect to an initial location of that via so as to provide a slightly modified resistance of the composite thin film resistor.

2. The thin film resistor structure of claim 1 wherein all of the thin film resistor sections are non-contiguous.

3. The thin film resistor structure of claim 2 including a conductive via on the second end of each of the thin film resistor sections, wherein the second conductor is electrically connected to the vias on the second ends of each of the thin film resistor sections.

4. The thin film resistor structure of claim 2 wherein the thin film resistor structure is included in a ladder resistor network of an integrated circuit digital to analog converter, wherein each resistor of the ladder resistor network is composed of at least one thin film resistor structure.

5. The thin film resistor structure of claim 2 wherein the locations of a plurality of the vias on the first ends of the thin film resistor sections are modified by at least a minimum address unit with respect to an initial locations of those vias, respectively.

6. The thin film resistor structure of claim 5 wherein the locations of a plurality of the vias on the second ends of the thin film resistor sections are modified by at least a minimum address unit with respect to initial locations of those vias, respectively.

7. The thin film resistor structure of claim 2 wherein the thin film resistor sections are composed of SiCr and the vias are composed of TiW.

8. The thin film resistor structure of claim 7 wherein each via is connected to the first conductor by means of a corresponding tungsten plug.

9. The thin film resistor structure of claim 7 wherein each via is a base portion of a thin film resistor head having a raised shoulder portion which does not physically contact the thin film resistor section on which that via is disposed, the shoulder portion extending beyond the base portion by a distance which corresponds to an adjustment range through which that via can be relocated to adjust the resistance of the thin film structure.

10. The thin film resistor structure of claim 4 wherein a number of the vias the locations of which are modified by a minimum address unit is sufficient to produce a predetermined change in the ratio of two resistors of the ladder resistor network which determine a value of an analog output signal of the digital to analog converter in response to a corresponding input bit applied to the digital to analog converter.

11. The thin film resistor structure of claim 1 wherein at least a plurality of the thin film resistor sections are contiguous so as to form a single thin film resistor layer.

12. The thin film resistor structure of claim 10 including a conductive via on the second end of each of the thin film resistor sections, wherein the second conductor is electrically connected to the via on the second end of each of the thin film resistor sections.

13. A thin film resistor structure, comprising:
   (a) a thin film resistive layer;
   (b) a first linear via disposed on a first end of the thin film resistive layer;
   (c) a first conductor electrically connected to the linear via of the thin film resistive layer and a second conductor electrically connected to a second end of the thin film resistive layer;
   (d) an edge of the linear via being modified in a nonlinear fashion with respect to a straight initial edge of the linear via by at least a minimum address unit with respect to an initial location so as to provide a slightly modified resistance of the composite thin film resistor.

14. The thin film resistor structure of claim 13 wherein the modified edge includes a narrow rectangular portion extending from the straight initial edge.

15. The thin film resistor structure of claim 13 wherein the modified edge includes a curved section.

16. The thin film resistor structure of claim 13 including another linear via similar to the first linear via disposed on a second end of the thin film resistive layer.

17. A method of modifying the resistance of an initial configuration of a thin film composite resistor which includes a plurality of thin film resistor sections with a conductive via disposed on a first end of each thin film resistor section, respectively, and a first conductor electrically connected to the vias of each of the thin film resistor sections, and a second conductor electrically connected to the second end of each of the thin film resistor sections, the first and second conductors electrically connecting the plurality of thin film resistor sections in parallel to form the composite thin film resistor, the method comprising:

(a) obtaining a distribution of a circuit parameter indicative of the resistance of the thin film composite resistor from a batch of the thin film composite resistors;

(b) determining from the distribution an amount by which one or more of the vias should be individually moved in order to cause a particular systematic change in the resistance of the thin film composite resistor.

18. The method of claim 17 wherein the thin film composite resistor is part of an R-2R ladder resistor in an R-2R digital to analog converter, wherein step (a) includes obtaining a value of a ratio of the thin film composite resistor and a similar thin film composite resistor and determining an amount of an error in the ratio.

19. The method of claim 18 including determining the amount of the error by measuring a voltage of a node between the thin film composite resistor and the similar thin film composite resistor.

20. The method of claim 18 including determining the amount of the error by determining a linearity error of an analog output signal produced by the digital to analog converter in response to an input bit of the digital to analog converter which corresponds to the ratio of the thin film composite resistor and the similar thin film composite resistor.

* * * * *